(12) United States Patent
Mihira

(10) Patent No.: US 6,469,284 B1
(45) Date of Patent: Oct. 22, 2002

(54) LAMP ANNEALER AND METHOD FOR CONTROLLING PROCESSING TEMPERATURE THEREOF

(75) Inventor: Jun Mihira, Tokyo (JP)

(73) Assignee: NEC Corporation, Tokyo (JP)

( * ) Notice: Subject to any disclaimer, the term of this patent is extended or adjusted under 35 U.S.C. 154(b) by 23 days.

(21) Appl. No.: 09/716,940

(22) Filed: Nov. 22, 2000

(30) Foreign Application Priority Data

Nov. 25, 1999 (JP) ............................................ 11-334438

(51) Int. Cl.$^7$ ................................................ H05B 1/02
(52) U.S. Cl. ........................ 219/486; 219/497; 392/416
(58) Field of Search ................................ 219/497, 494, 219/501, 506, 483, 486; 392/416, 418; 118/724, 725

(56) References Cited

U.S. PATENT DOCUMENTS

| | | | |
|---|---|---|---|
| 5,155,336 A | | 10/1992 | Gronet et al. |
| 5,305,417 A | | 4/1994 | Najm et al |
| 5,449,883 A | * | 9/1995 | Tsuruta ........................ 219/483 |
| 5,635,409 A | | 6/1997 | Moslehi |
| 5,900,177 A | * | 5/1999 | Lecouras et al. ............ 219/497 |
| 6,064,799 A | * | 5/2000 | Anderson et al. ............ 392/416 |
| 6,207,936 B1 | * | 3/2001 | de Waard et al. ............ 219/497 |
| 6,210,484 B1 | * | 4/2001 | Hathaway .................... 118/724 |

* cited by examiner

Primary Examiner—Mark Paschall
(74) Attorney, Agent, or Firm—Young & Thompson

(57) ABSTRACT

A fluctuation of a transistor characteristic is calculated based on deviation of the value measured for each of specified steps, and total fluctuation of the transistor characteristic is calculated for the previous steps prior to an annealing step. The processing temperature of the annealing step is controlled to cancel the total fluctuation of the transistor characteristic caused by the previous steps to obtain a designed transistor characteristic. The control of the processing temperature is effected for each zone of a wafer.

11 Claims, 4 Drawing Sheets

LAMP ANNEALER AND METHOD FOR CONTROLLING PROCESSING TEMPERATURE THEREOF

BACKGROUND OF THE INVENTION (a) Field of the Invention

The present invention relates to a lamp annealer for use in a semiconductor fabrication process and a method for controlling the processing temperature thereof.

(b) Description of the Related Art

Conventionally, the characteristics of MOS transistors have been controlled by adjusting the amount of impurities injected under the gate insulator film. On the other hand, along with the development of finer patterning of the semiconductor device, the allowable margin in each manufacturing step has been reduced. Especially, the transistor characteristic, such as the threshold voltage of the MOS transistor, greatly depends on the shape of the vicinity of the gate electrode, the dimension of the gate length, and the thickness of the side-wall film formed on the gate electrode. In this respect, the control of the transistor characteristic is generally impossible after the gate electrode is formed in the conventional technique.

SUMMARY OF THE INVENTION

It is an object of the present invention to provide a lamp annealer and a method for controlling the processing temperature of the lamp annealer, wherein one or more of the transistor characteristics of the final product can be adjusted by changing the processing conditions effected by the lamp annealer system.

The present invention provides a lamp annealer system including a processing chamber for receiving therein a wafer, a lamp block including a plurality of zone segments each capable of heating a corresponding portion of the wafer at an output power independent of the output power of the other zone segments, a plurality of thermometers each for measuring a temperature of a corresponding portion of the wafer, and a control section for controlling an output power of each of said zone segments of said lamp block based on the temperature measured by a corresponding one of the thermometers.

In accordance with the lamp annealer system of the present invention, the lamp block, including a plurality of zone segments, which are capable of being controlled for the output power thereof independently of each other, enables the in-plane fluctuations of a transistor characteristic on the wafer surface to be reduced, by controlling the temperature of each of the zone segments of the lamp block.

The present invention also provides a method for fabricating a semiconductor device including the steps of measuring a value of an item of a processing condition for a wafer in each of specified work steps, the item affecting a transistor characteristic of a final product obtained from the wafer, calculating a fluctuation in the transistor characteristic caused by the value of the item, adding the calculated fluctuations together in the specified work steps prior to an annealing step to calculate a total fluctuation, annealing the wafer while controlling a processing temperature based on the total fluctuation and a numerical expression showing a relationship between the processing temperature and the transistor characteristic.

In accordance with the method of the present invention, the fluctuations (or variations) of the transistor characteristic, such as the threshold voltage, break down voltage, and operational speed of a MOS transistor, can be reduced by controlling the annealing temperature during the lamp annealing step.

In a preferred embodiment of the method of the present invention, the lamp block used in the lamp annealing processing has a plurality of zone segments capable of being controlled for the output power thereof independently of each other, thereby reducing the in-plane variation of the transistor characteristic on the wafer surface.

PREFERRED EMBODIMENTS OF THE INVENTION

Now, concrete examples of the present invention will be described below. However, the present invention is not limited to the examples described below.

Figure 1:
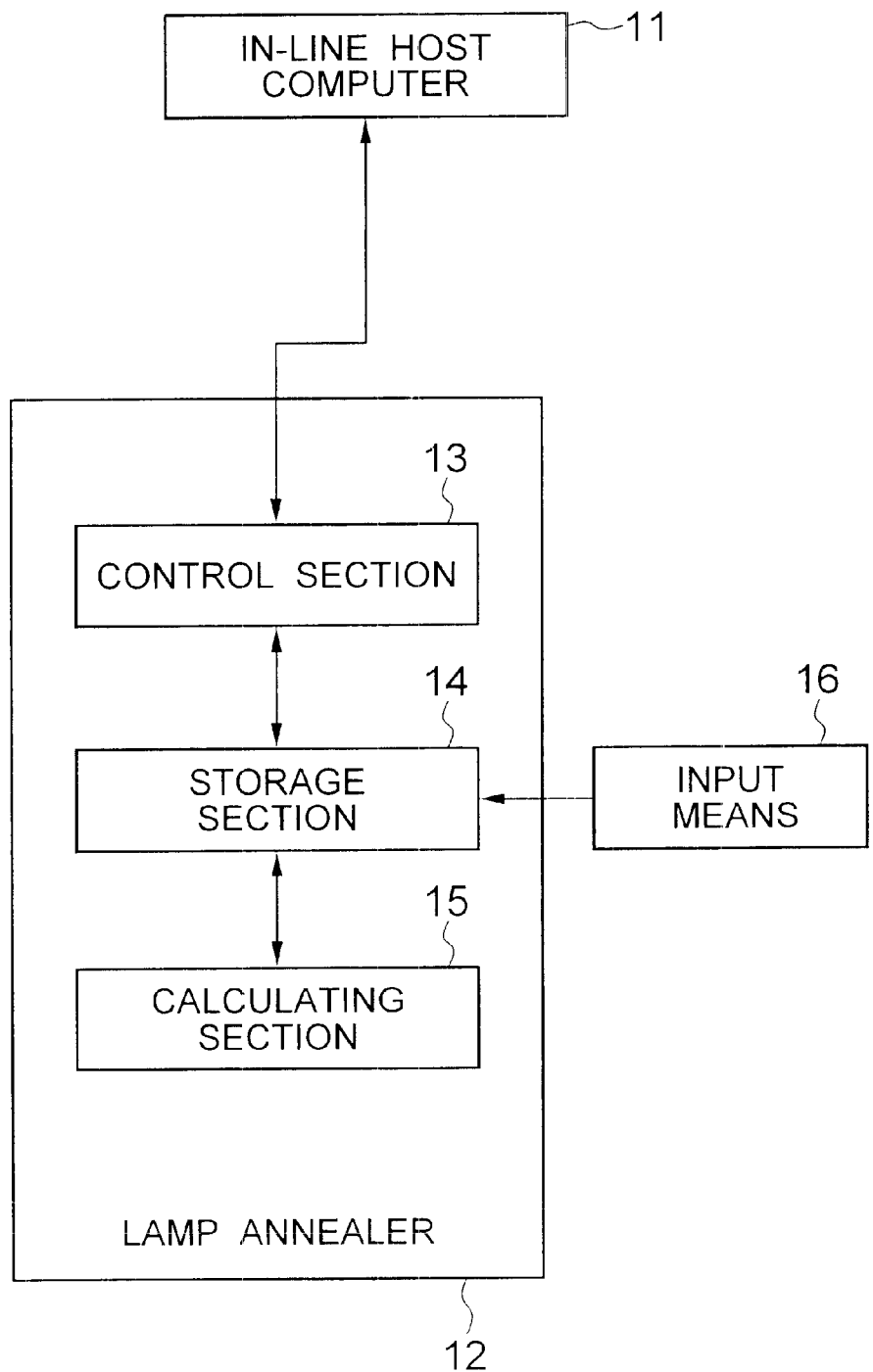
FIG. 1 is a block diagram showing a processing temperature control system of a lamp annealer according to an embodiment of the present invention.

Referring to FIG. 1, a processing temperature control system according to an embodiment of the present invention includes an in-line host computer 11 for implementing an in-line lot control section and a data base of the work history effected until the previous step, and a control block of the lamp annealer 12.

The control block of the lamp annealer 12 includes a storage section 14 for storing data for one or more of the transistor characteristics, such as the threshold voltage (VT), breakdown voltage (BVDS) and operational speed (ION) of the transistors in the wafer, an input means 16 for inputting data to the storage section 14, a calculating section 15 for calculating the data, and a control section 13 for receiving the stored data from the storage section 14 and the calculating section 15 to control the lamp annealer 12. The arrows illustrated in FIG. 1 mean the directions of the information.

Figure 2:
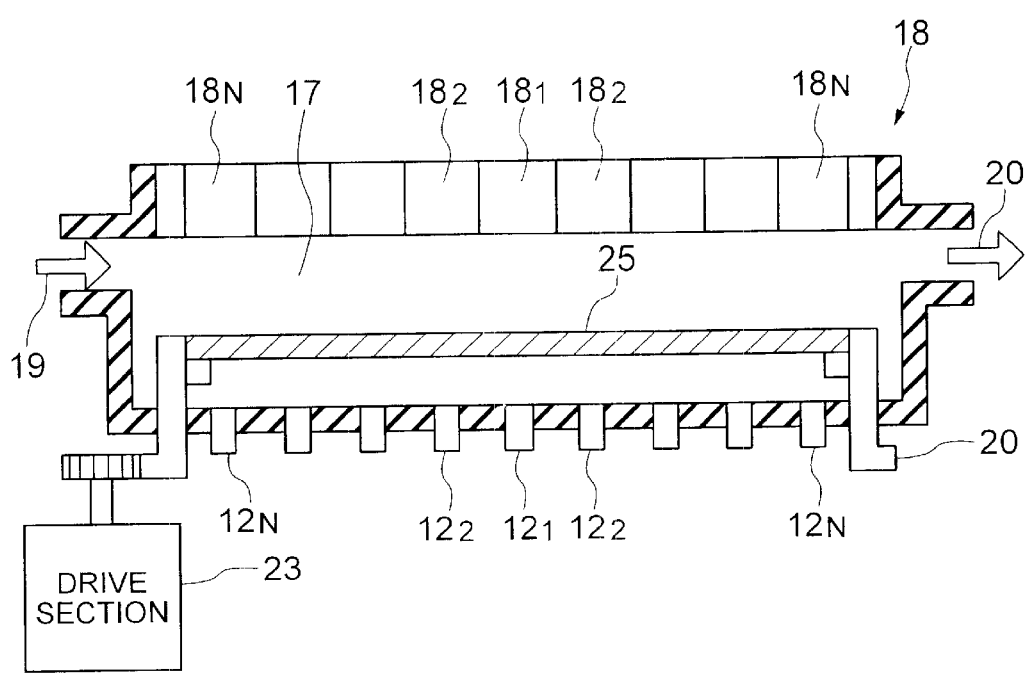
FIG. 2 is a schematic diagram showing the structure of the processing chamber and accessories of the lamp annealer of the embodiment.

In addition, the lamp annealer 12 has a structure as a processing chamber and accessories thereof shown in FIG. 2. More specifically, the lamp annealer 12 includes a processing chamber 17 having a structure capable of being sealed from the open air during processing a wafer 25, a circular lamp or lamp block 18 including a plurality of annular zone segments $18_1$ to $18_N$ arranged in a radial direction for heating respective areas of the wafer, a gas inlet port 19 for introducing a process gas to the processing chamber 17, a gas exhaust port 20 for exhausting the process gas from the processing chamber 17, a wafer support member 21 for supporting the wafer 25, a drive section 23 for rotating the wafer support member 21, and a plurality of pyrometers $22_1$ to $22_N$ each for measuring the wafer temperature at a specified position on the bottom surface of the wafer 25.

Figure 3:
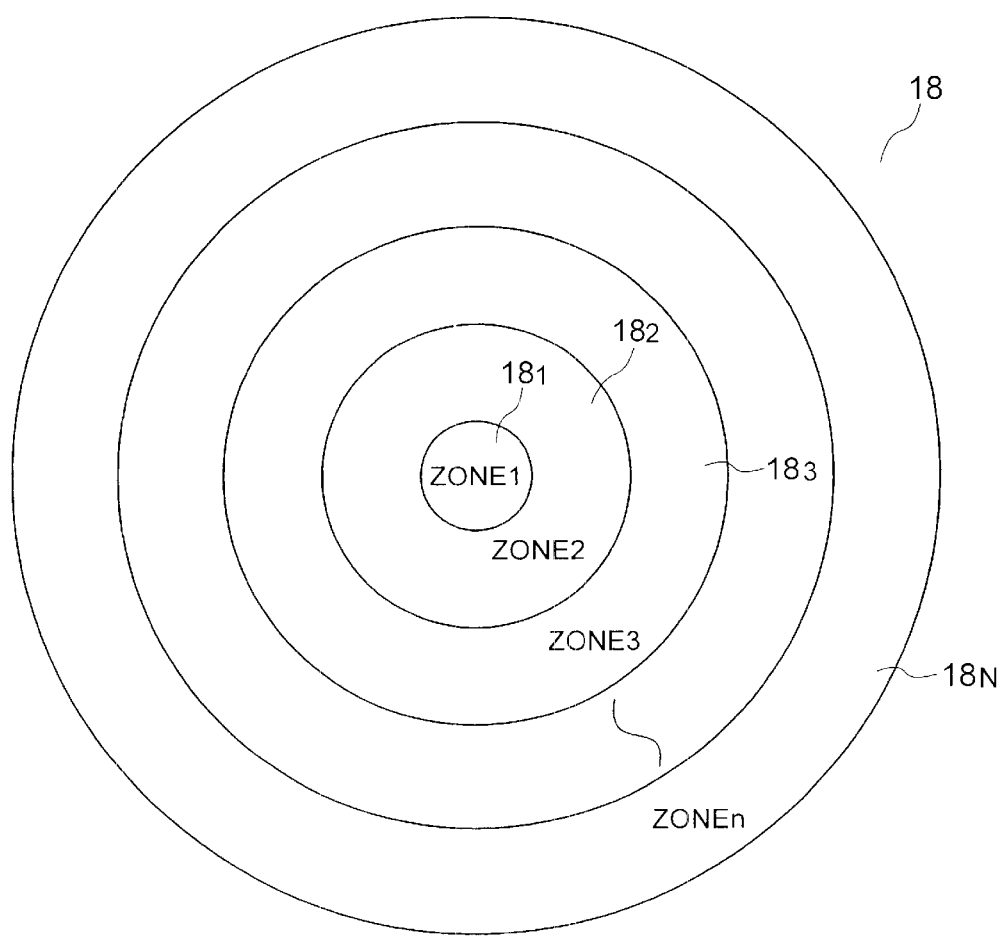
FIG. 3 is a diagram showing zone segments of the lamp block of the lamp annealer of the embodiment.

The wafer 25 under processing is located on the wafer support member 21. The lamp block 18 is divided into "N" zone segments $18_1$, $18_2$, ... $18_N$, and can be adjusted in the output power of the lamp block for each of the zone segments $18_1$, $18_2$, ... $18_N$. In addition, the pyrometers $22_1$, $22_2$, $22_N$ are disposed corresponding to the zone segments $18_1$, $18_2$, ... $18_N$ of the lamp block 18 in a one-to-one correspondence, whereby the pyrometers $22_1$, $22_2$, ... $22_N$ monitor the wafer temperature for respective zone segments of the lamp block 18. FIG. 3 shows the top plan view of the zone segments of the lamp block 18, wherein annular zone segments $18_1$, $18_2$, ... $18_N$ having a substantially equal width are arranged in a radial direction.

Next, an exemplified operation of the system will be described with reference to FIGS. 1 to 4 and Tables 1 and 2. In Tables 1 and 2, condition items include items which affect the transistor characteristics, such as gate length and the thickness of the gate side-wall film which are determined by the actual process conditions. "X" is the parameter for each item to be used for defining the specified transistor characteristic (or threshold voltage VT), and $Y_1$ to $Y_n$ are design values or standard values for the respective items. In this example, it is assumed that the threshold voltage VT is affected by quadratic of the parameter for each item, as shown by the columns of the expression for VT.

Figure 4:
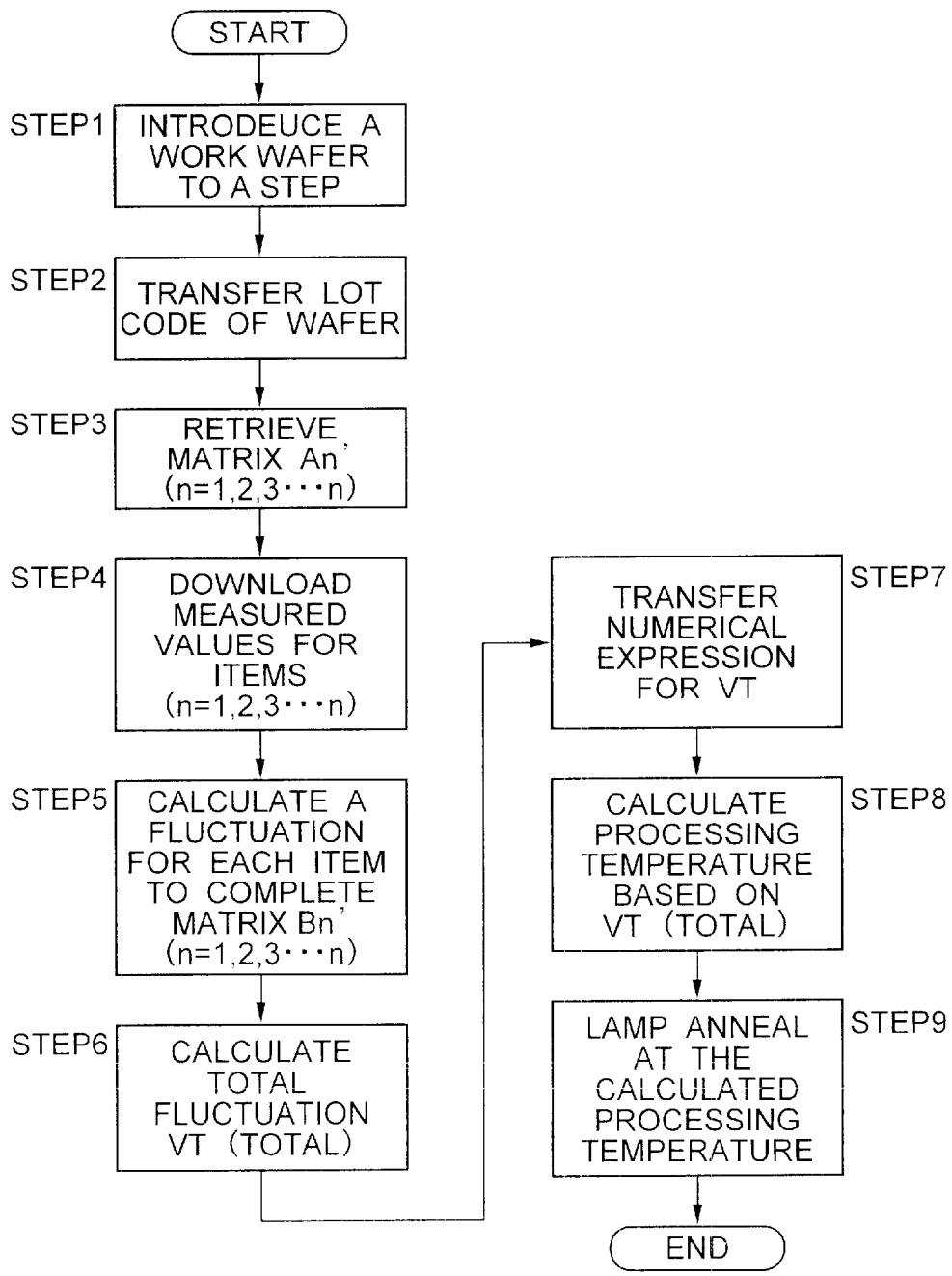
FIG. 4 is a flowchart showing an example of operations of the processing temperature control system of the embodiment.

In FIG. 4, when a wafer is introduced to each of specified work steps, the in-line host computer 11 recognizes the wafer (step 1) and transfers the lot code "A" thereof to the control section 13 of the lamp annealer 12 (step 2). The control section 13 retrieves, from the storage section 14, the matrix An' shown by Table 1 corresponding to the final product defined by the lot code "A" (step 3). The lot code defines the type of the final product as well as the lot number of the wafer.

The matrix An' includes columns for condition items ($X_1$ to $X_N$: such as the dimension of gate length, and the thickness of the side-wall film), the design values or standard values for the items, and relational expressions showing the relationships between the condition items and the specified item (VT) of the transistor characteristics. The columns for condition items, design values and the expressions for VT are filled beforehand with the data input by the external input means 16, whereas the remaining columns are blank at this stage.

The control section 13 requests the data for the blank columns of the matrix An' from the in-line host computer 11, and the data $S_1$ to $S_n$ obtained by measurements in the respective work steps are transferred from the in-line host computer 11 to the control section 13. Then, some of the columns of the matrix Bn' shown in Table 2 are filled (step 4) with the transferred data $S_1$ to $S_n$.

The control section 13 transfers the matrix Bn' to the calculating section 15, which calculates a VT fluctuation $VT_1$, $VT_2$, ... $VT_n$ for each item (step 5). Based on these VT fluctuations $VT_1$, $VT_2$, ... $VT_n$ of the respective items, the total fluctuation VT(total)=$\Sigma_{n=1\sim n}$VTn is calculated (step 6).

Subsequently, a numerical expression (VT=cZ+d), wherein "Z" is the lamp anneal processing temperature, "c" and "d" are constants, is transferred from the storage section 14 to the calculating section 15 (step 7). The numerical expression is registered corresponding to the type of the final product defined by the lot code and shows the relationship between the lamp anneal processing temperature and the threshold voltage VT of the transistor. Then, the lamp anneal processing temperature is calculated based on the numerical expression and the total fluctuation VT(total) so as to cancel the total fluctuation VT(total) by selecting the calculated processing temperature (step 8).

The matrixes $A_1$ to $A_N$ are prepared beforehand corresponding to respective zone segments of the lamp block 18, whereby the processing temperature for each zone segment is calculated based on the numerical expression and the total fluctuation. The calculated temperatures are delivered to the control section 13, which adjusts the output power of each zone segment for processing the wafer by selecting the calculated processing temperature for the lamp anneal processing temperature (step 9).

Thus, according to the present embodiment, by predicting the fluctuations of the transistor characteristic until the previous step prior to the lamp annealing step and changing the heat processing temperatures within the wafer surface, the in-plane variations of the characteristic can be reduced.

In the above embodiment, the calculation for VT and the processing temperature is conducted by assuming that the relationship between each condition item and VT is quadratic and the relationship between the lamp anneal temperature and VT is linear. However, The number of exponential order in the relational expression can be selected by conducting experiments. In addition, it is assumed in the above embodiment that the relational expression between each item and VT is not affected by the measurements for the other condition items. However, if a plurality of relational expressions for VT are input beforehand by the external input means for respective cases of the measurements of a specified condition item, the relational expression for VT may be automatically changed for calculation based on the actual measurement of the specified condition item.

In the above embodiment, the relational expression between the condition item and VT as well as the numerical expression between the lamp anneal processing temperature and VT are stored in the storage section 14 of the lamp annealer 12, and the calculation is conducted by the calculating section 15 in the lamp annealer 12. However, since a large amount of data for the measurements until the previous step must be downloaded from the in-line host computer 11 to the lamp annealer 12 in the present embodiment, there is some drawback that the throughput of the system is not satisfactory.

In an alternative, the functions of the storage section 14 and the calculating section 15 are allocated to the in-line host computer 11. In this configuration, the processing conditions can be determined before the lot is introduced to the lamp anneal step, whereby a higher through-put can be obtained.

According to the present invention, the processing condition, i.e., the in-plane temperatures of the wafer surface effected by the lamp annealer, can be automatically determined based on the work history of the wafer until the previous step, thereby allowing change of the processing condition so as to adjust the transistor characteristic of the final product. In other word, by predicting the fluctuations of the characteristic until the previous step and changing the processing temperatures within the wafer surface, the in-plane variations of the characteristic can be reduced.

What is claimed is:

1. A lamp annealer comprising:

a processing chamber for receiving a wafer;

a plurality of annealing lamps in communication with said processing chamber for heating said wafer, each annealing lamp individually heating a different zone segment of said wafer;

a plurality of temperature sensing devices for measuring a temperature of a corresponding zone segment;

a data storage section for storing measured physical characteristic values and design physical characteristic values of each transistor of the wafer;

a controller for calculating a transistor operational characteristic fluctuation based on a function of both the measured physical characteristic values and the design physical characteristic values and for controlling an output power of each said plural annealing lamps based on the calculated transistor operational characteristic fluctuation.

2. The lamp annealer according to claim 1, wherein the plural temperature sensing devices measure different temperatures of said wafer at each zone segment.

3. The lamp annealer according to claim 1, wherein the measured physical characteristic values are at least one of gate length and sidewall film thickness.

4. The lamp annealer according to claim 1, wherein the transistor operational characteristic is one of threshold voltage, break down voltage and operational speed of a MOS transistor.

5. A method of adjusting lamp anneal processing temperatures within a wafer surface, comprising the steps of:

placing a wafer into a processing chamber of a lamp annealer;

retrieving a data matrix from a storage section of the lamp annealer, the data matrix comprising transistor design physical characteristic data;

downloading transistor measured physical characteristic data from an in-line host computer to a control section of the lamp annealer;

calculating a transistor operational characteristic fluctuation from the measured physical characteristic data;

calculating the lamp anneal processing temperature from the transistor operational characteristic fluctuation;

adjusting an output power of an anneal lamp to process a wafer at the calculated lamp anneal processing temperature.

6. A method of adjusting processing temperatures within a wafer surface, comprising the steps of:

measuring at least one physical characteristic of a gate electrode of a MOS transistor on a wafer;

calculating a fluctuation of a transistor operational characteristic of the MOS transistor based on the measured physical characteristic; and annealing the wafer while controlling a processing temperature based on the calculated fluctuation in the transistor operational characteristic.

7. The method as claimed in claim 6, wherein in said measuring step, the physical characteristic measured is one of i) a value of a gate length and a sidewall thickness and ii) both the gate length and the sidewall thickness.

8. The method according to claim 7, wherein in said calculating step, a total fluctuation of the transistor operational characteristic is calculated based on each physical characteristic.

9. The method according to claim 6, wherein the transistor operational characteristic is selected from one of threshold voltage, break down voltage and operational speed of the MOS transistor.

10. The method according to claim 6, wherein the transistor operational characteristic is threshold voltage and in said calculating step, the threshold voltage is calculated for each of a plurality of zone segments of the wafer, and in said annealing step, the processing temperature is controlled for the plural zone segments.

11. The method as claimed in claim 10, wherein in said annealing step, the processing temperature is controlled for the plural zone segments at different temperatures for each zone segment.

* * * * *